United States Patent [19]

Sone

[11] Patent Number: 4,603,265
[45] Date of Patent: Jul. 29, 1986

[54] JOSEPHSON DEVICE

[75] Inventor: Jun'ichi Sone, Kawasaki, Japan

[73] Assignees: Agency of Industrial Science & Technology; Ministry of International Trade & Industry, both of Tokyo, Japan

[21] Appl. No.: 589,657

[22] Filed: Mar. 14, 1984

[30] Foreign Application Priority Data

Apr. 5, 1983 [JP] Japan .................................. 58-58592

[51] Int. Cl.⁴ ...................... H03K 3/38; H03K 19/195
[52] U.S. Cl. .................................... 307/306; 307/277; 307/517
[58] Field of Search ............... 307/306, 277, 517, 518, 307/601; 357/5

[56] References Cited

U.S. PATENT DOCUMENTS 4,149,097 4/1979 Faris .................................... 307/277

Primary Examiner—John Zazworsky
Attorney, Agent, or Firm—Oblon, Fisher, Spivak, McClelland & Maier

[57] ABSTRACT

A Josephson device applicable to a down-edge detecting circuit and to a sense circuit comprises a first gate circuit and a second gate circuit each incorporating Josephson junctions, with an input line of the first gate circuit and a first input line of the second gate circuit serially connected to each other and an output line of the first gate circuit connected to a second input line of the second gate circuit so as to allow the second input line to flow an input current in the direction opposite the current flowing through the first input line. With this device, a down-edge detecting circuit which provides a wide operating margin for the gate current and permits high density circuit integration can be realized. The device can further be used to form a sense-bus circuit.

10 Claims, 14 Drawing Figures

JOSEPHSON DEVICE

BACKGROUND OF THE INVENTION

1. Field of the Invention

This invention relates to a Josephson device, and more particularly to a Josephson device capable of providing a down-edge detecting circuit and a sense circuit which are each formed of a Josephson junction integrated circuit.

2. Discussion of Background

The Josephson device operates at high speed with extremely low power consumption. It is capable of providing switching elements of various types and promises to make possible a super-performance computer.

The basic quantum interference logic gate device utilizing the Josephson effect is formed of a closed loop structure incorporating at least two Josephson junctions and a control input line. This device assumes a voltage state by inputting a control current through the control input line to output a current through an output line connected to a current feed line called the "gate line". The operating mechanism, as well as the latching operation of the Josephson device, is well known in the art. In latching operation, once the current flowing through the control input line causes transition of the junction from the superconducting state (zero voltage state) to the resistive state (voltage state), the junction remains in the voltage state and continues to output an electric current through the output line even after the control input current is removed.

For some applications of the Josephson junction integrated circuit, another type of operation is required in which no output current appears during the rise of the control input current and an output current appears in the output line during the fall of the control input current. The circuit of this description is called a down-edge detecting circuit. It finds utility, for example, in a sense-bus circuit for a memory circuit. Realization of this utility, however, is not easy because the Josephson device is characterized by operating in the latching mode as described above.

There has been proposed a down-edge detecting circuit using Josephson junctions (S. M. Faris and A. Davidson, "Josephson edge detector, a novel switching element", IEEE Transactions on Magnetics, Vol. MAG-15, No. 1, pp. 416–419, January 1979). The down-edge detecting circuit is composed of a quantum interference gate with an extremely asymmetrical control characteristic by setting the magnitudes of the Josephson currents of a plurality of Josephson junctions composing the gate at extremely different values, by suitably selecting the position for injection of a gate current to the aforementioned closed loop circuit, and by setting the magnitude of the inductance composing the gate at a large value. Such a quantum interference gate produces extreme asymmetry in the critical points which appear on both sides of vortex mode in a control characteristic and defines the boundary between vortex-to-vortex switchings.

The value of the gate current is set between the values of the gate current corresponding to the upper critical point and the lower critical point so that, upon application of an input current with one polarity, the transition of the operating point in the vortex mode occurs below the upper critical point to give rise to a switching to another vortex mode with no output current and, on the other hand, upon elimination of an input current, the transition of the operating point in the vortex mode occurs above the lower critical point to give rise to a switching to the voltage state and the output current begins to flow through the output line.

The down-edge detecting circuit by the method described above, however, entails the following disadvantage. The gate currents of the aforementioned gate circuit are required to be set between the gate currents of the values corresponding to the upper critical point and the lower critical point. For the gate currents to have sufficient operating margins, the aforementioned values of the critical points are required to be set wide apart. Wide differentiation of the values of the critical points to ensure wide operating margins implies the necessity of sufficiently increasing both the values of inductance and the ratio between the critical currents of the Josephson junctions. Realization of inductance with a large value on actual integrated circuit chips entails a marked addition to the area occupied in such chips. An increase in the ratio between the critical currents of the Josephson junction entails an increase in the area occupied by the junctions with larger critical current because of the technological limit on fabrication of junctions with small size. Thus, neither of the measures proves appropriate for the purpose of high integration of circuits. Further, since the critical points are strongly affected by the dynamic operating property of the gate, it has been difficult to design and realize these points at proper values.

SUMMARY OF THE INVENTION

An object of this invention is to provide a Josephson device which is easy to design and fabricate, capable of reduction in device size to such a degree as to contribute to higher circuit integration, and advantageously applicable to down-edge detecting circuits and sense circuits.

To accomplish the object described above according to this invention, there is provided a Josephson device which comprises a first gate circuit composed of a loop circuit incorporating a plurality of Josephson junctions, an input line, a gate current line, and an output line; and a second gate circuit composed of a loop circuit incorporating a plurality of Josephson junctions, first and second input lines, a gate current line, and an output line, with the input line of the first gate circuit serially connected to the first input line of the second gate circuit and the output line of the first gate circuit connected to the second input line of the second gate circuit in such a manner that current will flow in the direction opposite that in which the current flows in the first input line.

In the device of this configuration, the second gate circuit is designed to have a control characteristic asymmetrical relative to the polarity of the current flowing through the input line and the second gate circuit will not be switched to the voltage state when the input current flows in normal direction and it will be switched to the voltage state when the input current flows in reverse direction. Consequently, no output appears on the output line of the second gate circuit during the rise of the input current to the first gate circuit and an output appears thereon during the fall of the input current to the first gate circuit. Thus, a down-edge detecting circuit is realized. This configuration calls for no addition to the difference between the critical values of the vortex mode and permits reduction of the dimensions of the device on the chip and, therefore, contributes to higher circuit integration.

When the Josephson device of this invention constructed as described above is further provided in parallel to the first input line of the second gate circuit with a third input line for supply of an input current in reverse direction relative to the input current flowing through the first input line, there is completed a similar down-edge detecting circuit without requiring the control characteristic of the second gate circuit to be made asymmetrical relative to the polarity of the input current.

When the Josephson devices of the two configurations described above are combined to complete a sense-bus circuit, this sense-bus circuit will be capable of efficiently executing the reading of the information stored in memory cells of the memory circuit.

The down-edge detecting circuit and the sense circuit which are provided by the present invention provide wide operating margins for the gate currents and obviate the necessity of using inductance of a large value and, therefore, contribute to higher circuit integration.

The other objects and characteristics of this invention will become apparent from the further disclosure of the invention to be made hereinafter with reference to the accompanying drawings.

DESCRIPTION OF THE PREFERRED EMBODIMENTS

This invention relates to a Josephson device suitable for a down-edge detecting circuit and a sense-bus circuit. Preparatory to the description of the Josephson device of this invention, the operating principle of the Josephson device as observed in the quantum interference logic gate will be described with reference to FIGS. 1(a) to 1(c).

Figure 1A:
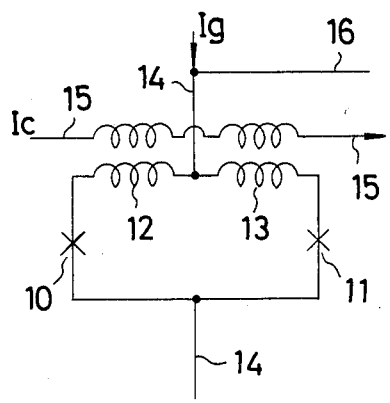
FIGS. 1(a) through 1(c) are an equivalent circuit diagram, a control characteristic diagram and a schematic diagram for illustrating a conventional quantum interference logic gate circuit using Josephson junctions.
Figure 1B:
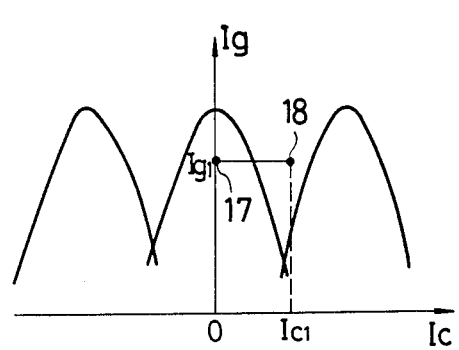
Figure 1C:
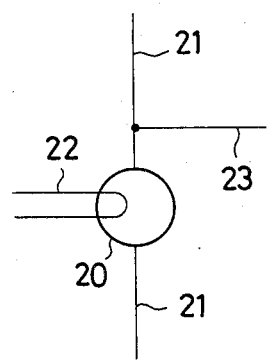

From IEEE Transactions on Electron Devices, Vol. ED-27, No. 10, pp. 1857–1869, it is evident that logic circuits using the Josephson junction device are well known in the art. The basic configuration of a typical logic gate circuit is schematically illustrated in FIG. 1(a). In this diagram, 10 and 11 stand for Josephson junctions, 12 and 13 for inductors, 14 for a gate current line, 15 for an input line, and 16 for an output line. FIG. 1(a) depicts a gate circuit incorporating two Josephson junctions. Optionally, the number of Josephson junctions in the gate circuit may be increased. Although the diagram shows only one input line 15, two or more input lines may be used in parallel. In FIG. 1(b), the maximum Josephson current flowing through the gate circuit mentioned above is represented on the vertical axis, the sum of the input current flowing through the input line of the gate circuit is represented on the horizontal axis, and 17 and 18 stand for the operating points of the gate circuit. In FIG. 1(c), 20 stands for a gate circuit, 21 for a gate current line, 22 for an input line, and 23 for an output line.

Figure 2:
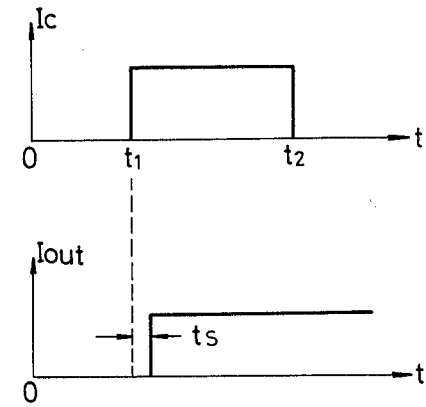
FIG. 2 is a time chart illustrating the flow of input and output currents in the gate circuit of FIG. 1(a).

When an input current $Ic_1$ flows to the aforementioned gate circuit already passing a gate current $Ig_1$, the operating point shifts from 17 to 18 and the aforementioned gate circuit switches to the voltage state to start flow of an output current to the output line 16. Since the gate circuit of this configuration generally operates in latching mode, the output current continues to flow through the output line 16 even after the flow of the input current is discontinued. FIG. 2 is a graph obtained by plotting the relation between the input current Ic and the output current $I_{out}$ of the aforementioned gate circuit. As is noted from this graph, the output current begins to flow through the aforementioned gate circuit with a delay of switching time $t_s$ from the rise time $t_1$ of the input current and the output current continues to flow even after the fall time $t_2$ of the input current.

As one required application of the Josephson integrated circuit, there is the down-edge detecting circuit, namely a gate circuit in which, quite contrary to the operation of the aforementioned gate circuit, no output current occurs when the input current rises and an output current occurs in the output line when the input current falls. The down-edge detecting circuit of this nature can be applied to a sense-bus circuit for a memory circuit, for example. Realization of this application, however, is not easy because the circuit of this nature operates in latching mode.

Figure 3A:
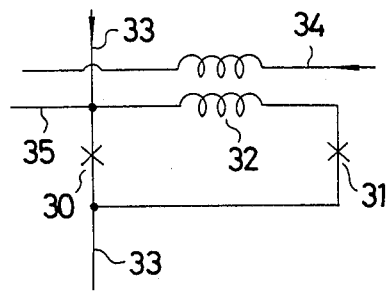
FIGS. 3(a) and 3(b) are an equivalent circuit diagram and a control characteristic diagram for illustrating a conventional down-edge detecting circuit.
Figure 3B:
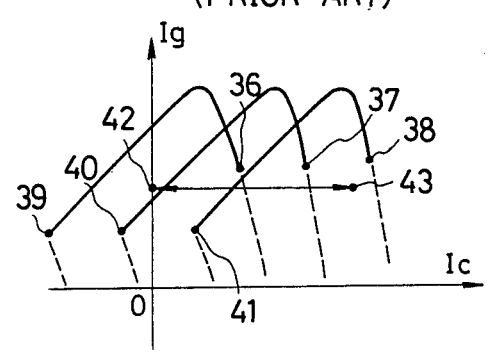
Figure 4:
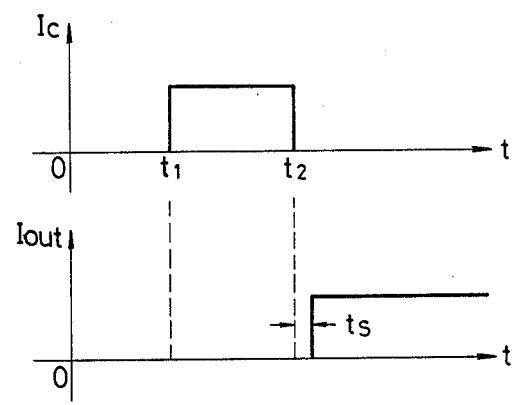
FIG. 4 is a time chart illustrating the flow of input and output currents in the down-edge detecting circuit of FIG. 3(a).

FIG. 3(a) shows an equivalent circuit of a conventional down-edge detecting circuit using Josephson junction devices. In the diagram, 30 and 31 stand for Josephson junctions, 32 for an inductor, 33 for a gate current line, 34 for an input line, and 35 for an output line. FIG. 3(b) illustrates the control characteristic of the aforementioned gate circuit as indicated by the maximum Josephson current Ig and the input current Ic allowed to flow through this gate circuit in a superconducting state. It is noted from this diagram that the control characteristic of the gate circuit repeats in cycles of $\phi_o/L$ (wherein L stands for the value of inductance of an inductor 32, and $\phi_o$ for magnetic flux quantum) relative to the input current Ic. Each cycle of the control characteristic is called a vortex mode. In this diagram, 36, 37 and 38 stand for upper critical points and 39, 40 and 41 for lower critical points. When the operating point crosses the vortex modes in the portions of the solid lines above the lower critical points 39, 40 and 41, the aforementioned gate circuit switches to the voltage state, with the result that the output current appears in the output line 35 of the gate circuit. On the other hand, when the operating point crosses the vortex modes in the portions of the dotted lines below the upper critical points 36, 37 and 38, the aforementioned gate circuit undergoes vortex transititon and shifts to the other vortex mode. At this time, the aforementioned gate circuit does not switch to the voltage state and the output current does not appear. When the value of the gate current for the aforementioned gate circuit is selected between the gate current value $P_1$ corresponding to the upper critical points 36, 37 and 38 and the gate current value $P_2$ corresponding to the lower critical points 39, 40 and 41, namely at the point 42 indicated in the diagram, for example, therefore, the flow of the input current causes the operating point to shift from 42 to 43. Since this shift occurs below the upper critical points 36, 37, the aforementioned gate circuit undergoes vortex transfer and does not switch to the voltage state. On the other hand, when the flow of the input current is eliminated, the operating point shifts from 43 to 42. In this case, the operating point crosses the vortex modes above the lower critical points 40, 41 and consequently the aforementioned gate circuit shifts to the voltage state and the flow of the output current appears in the output line 35. The input current Ic and the output current $I_{out}$ of the aforementioned gate circuit are plotted over the course of time in FIG. 4. From this diagram, it is noted that the flow of the output current does not appear at the time $t_1$ when the input current rises but appears with a delay of switching time $t_s$ of the aforementioned gate circuit from the time $t_2$ when the input current falls.

As described above, the aforementioned detecting circuit materializes a down-edge detecting circuit using one gate circuit. This configuration of the down-edge detecting circuit, however, entails the following disadvantage. Since the gate current for the aforementioned gate circuit must be selected between $P_1$ and $P_2$, the difference between $P_1$ and $P_2$ must be increased to provide an ample operating margin for the gate current. The difference between $P_1$ and $P_2$ depends on the inductance L of the inductor 32 and on the ratio of the critical currents $I_1$ and $I_2$ of the Josephson junctions 30, 31. For the gate circuit to have an amply wide operating margin, therefore, it becomes necessary to increase the value of L as compared with $\phi_o/I_2$ or to increase amply the ratio $I_1/I_2$ of the critical currents of the two Josephson junctions. When the inductance L is made large, a large area on the device is required for the inductor. Thus, use of a large inductance runs counter to the aim of attaining high integration. An increase of the ratio of $I_1/I_2$ necessitates reduction of the size of the Josephson junction 31 having the smaller critical current $I_2$. Because of the limit to the technology available today, the size of the Josephson junction 31 cannot be decreased as desired. There is no alternative but to increase the device area of the Josephson junction 30. But this increase is not desirable from the viewpoint of attaining high integration. Further, the value $P_1$ for the upper critical points 36, 37, and 38 and the value $P_2$ for the lower critical points 39, 40, and 41 are affected by the dynamic characteristic of the aforementioned gate circuit and, therefore, cannot be set freely in designing the circuit.

The down-edge detecting circuit by the Josephson device of this invention overcomes the disadvantage suffered by the conventional countertype. It will be described below with reference to FIG. 5 and the following drawings.

Figure 5:
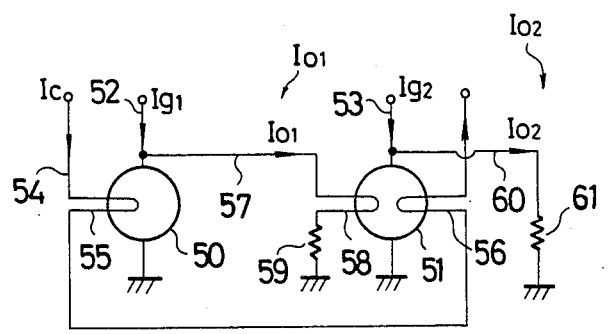
FIG. 5 is an equivalent circuit diagram for illustrating a down-edge detecting circuit as the first embodiment of the Josephson device of this invention.
Figure 6:
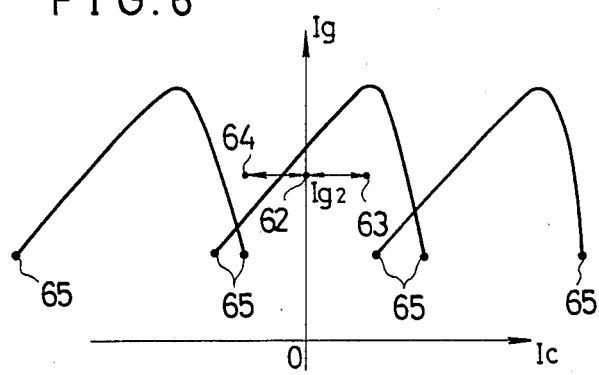
FIGS. 6 and 7 are a diagram illustrating the control characteristic in the down-edge detecting circuit of FIG. 5 and a time chart illustrating the flow of input and output currents in the circuit of FIG. 5.

The first embodiment of this invention illustrated in FIG. 5 connects gate current lines 52, 53 respectively to two interference gate circuits 50, 51 each incorporating a plurality of Josephson junctions and inductances so as to supply gate currents $I_{g1}$ and $I_{g2}$ thereto. For the sake of convenience, the interference gate circuit 50 will be referred to as the first gate circuit and the interference gate circuit 51 as the second gate circuit. An input line 54 which serves to pass an input current $I_c$ connects an input line 55 of the first gate circuit 50 serially to a first input line 56 of the second gate circuit 51. An output line 57 of the first gate circuit 50 is connected to a second input line 58 of the second gate circuit 51 and is terminated through a load resistor 59. An output line 60 of the second gate circuit 51 is terminated through a load resistor 61. FIG. 6 represents the control characteristic of the second gate circuit 51. In the diagram, the maximum Josephson current allowed to flow through the second gate circuit in a superconducting state is represented on the vertical axis and the sum of input current flowing through the first and second input lines 56, 58 is represented on the horizontal axis. By 63, and 64, are denoted operating points of the second gate circuit. As noted from the diagram, the second gate circuit 51 possesses a control characteristic asymetrical relative to the polarity of the input current. The first gate circuit 50 is made to assume a control characteristic which is symmetrical as illustrated in FIG. 1(b).

Figure 7:
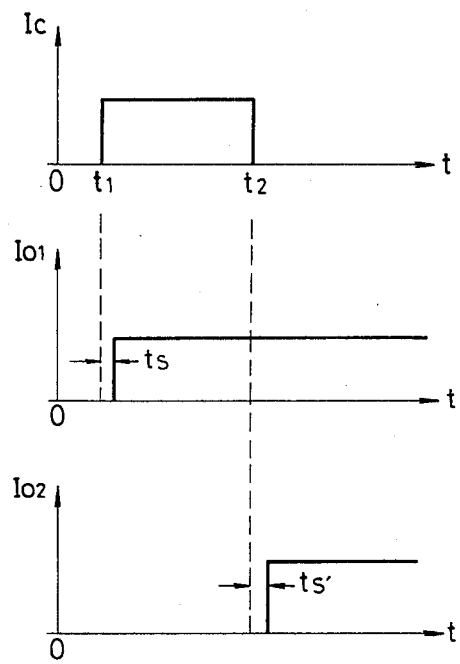

When the input current Ic is fed through the input current line 54 to the first and second gate circuits 50, 51 which are passing the gate currents $I_{g1}$, $I_{g2}$, the first gate circuit 50 switches to the voltage state to start the flow of the output current $I_{o1}$ through the output line. On the other hand, in the second gate circuit 51, when the input current Ic is fed to the first input line 56, the operating point shifts from 62 to 63. Because of its asymmetrical control characteristic, however, the second gate circuit 51 remains in its zero voltage state. Then, with a delay of the switching time $t_s$ of the first gate circuit 50, the output current $I_{o1}$ of the first gate circuit 50 is fed to the second input line 58 of the second gate circuit 51. Since the first and second input lines 56, 58 are disposed so that the input currents flow therethrough in mutually opposite directions, the effects of the input currents are mutually offset and the operating point shifts from 63 to 62 and the second gate circuit 51 continues to remain in the zero voltage state. When the flow of the input current is discontinued, the input current flowing through the first input line 56 ceases to flow. Since the first gate circuit 50 operates in the latching mode, the flow of the output current $I_{o1}$ continues. Consequently, the flow of input current continues in the second input line 58. As a result, the operating point shifts from 62 to 64 and the second gate circuit 51 switches to the voltage state to start the flow of the output current $I_{o2}$ through the output line 60. FIG. 7 plots the relation between the input current Ic and the output currents $I_{o1}$, $I_{o2}$ over the course of time. As is readily inferred from the foregoing explanation, the output current $I_{o2}$ begins to flow through the output line 60 with a delay of the switching time $t_s'$ of the aforementioned gate circuit 51 from the time the flow of the input current Ic is discontinued. This fact shows that the circuit of the present embodiment constitutes itself a down-edge detecting circuit.

In the down-edge detecting circuit of the present invention, the operating region of the gate current $Ig_2$ extends from the critical point 65 shown in FIG. 6 to the maximum Josephson current in the absence of the input current. Thus, the operating region can be designed to be considerably wider than in the conventional countertype shown in FIGS. 3(a) and 3(b). This situation holds true with the first gate circuit. The conventional gate circuit is required to select the value of inductance L of the inductor 32 at a high level to widen the difference between the gate current value $P_1$ corresponding to the upper critical points 36, 37, and 38 and the gate current value $P_2$ corresponding to the lower critical points 39, 40, and 41 illustrated in FIG. 3. In the present invention, the values of $P_1$ and $P_2$ may be equal and the inductance is not required to be selected at a high level. This fact implies that the area of the device materialized on the chip can be reduced and that the configuration contemplated lends itself to high density integration.

Figure 8:
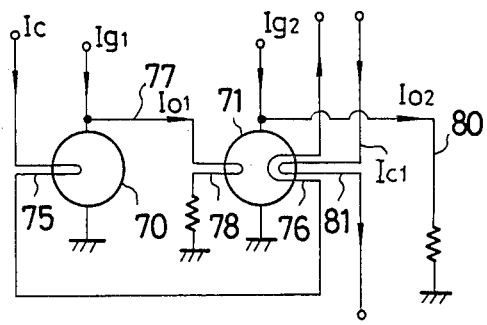
FIG. 8 is an equivalent circuit diagram for illustrating a down-edge detecting circuit as the second embodiment of the Josephson device of this invention.
Figure 9:
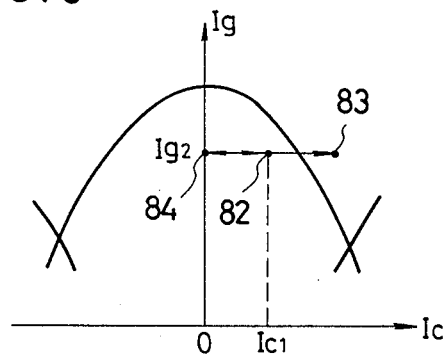
FIG. 9 is a diagram illustrating the control characteristic of the down-edge detecting circuit of FIG. 8.

FIG. 8 is a circuit diagram for illustrating the second embodiment of this invention and FIG. 9 is a diagram showing the control characteristic thereof. A gate current $Ig_1$ is fed to a first gate circuit 70, a gate current $Ig_2$ to a second gate circuit 71, and an input current $Ic_1$ to an input line 81. The operating point of the second gate circuit 71 in this configuration is indicated as 82 in FIG. 9. Then, as the input current Ic is fed through an input current line 75, the first gate circuit 70 switches to the voltage state and the flow of the output current $Io_1$ to an output line 77 begins with a delay of the switching time $t_s$. If the magnitude of the input current $Ic_1$ and that of the input current Ic are set equally, the effects of these two currents are mutually offset because the input currents flow in mutually opposite directions through a first input line 76 and a third input line 81 of the second gate circuit 71. Consequently, the operating point of the second gate circuit 71 shifts to 84 and the gate circuit itself does not switch to the voltage state. Subsequently, the flow of the aforementioned output current $Io_1$ to a second input line 78 is started after lapse of the aforementioned switching time $t_s$. Consequently, the operating point of the second gate circuit again shifts to 82 and the second gate circuit 71 continues to remain in the zero voltage state. The flow of the input current through the first input line 76 is discontinued as the flow of the input current Ic stops. In the meantime, the output current $Io_1$ which flows through the output line 77 continues its flow because the second gate circuit 71 operates in the latching mode. As a result, the currents flowing through the second and third input lines 78, 81 are combined, the operating point of the second gate circuit 71 shifts to 83, the gate circuit itself switches to the voltage state, and the flow of the output current $Io_2$ begins in the output line 80. The explanation so far made shows that the circuit contemplated in the present embodiment operates as a down-edge detecting circuit. Similarly to the down-edge detecting circuit of the first embodiment illustrated in FIG. 5, the present down-edge detecting circuit realizes much wider operating regions for the gate currents $Ig_1$, $Ig_2$ than the conventional countertype. It also enjoys the advantage that it does not require the inductance L to be selected at a high level and, therefore, contributes to denser circuit integration.

Figure 10:
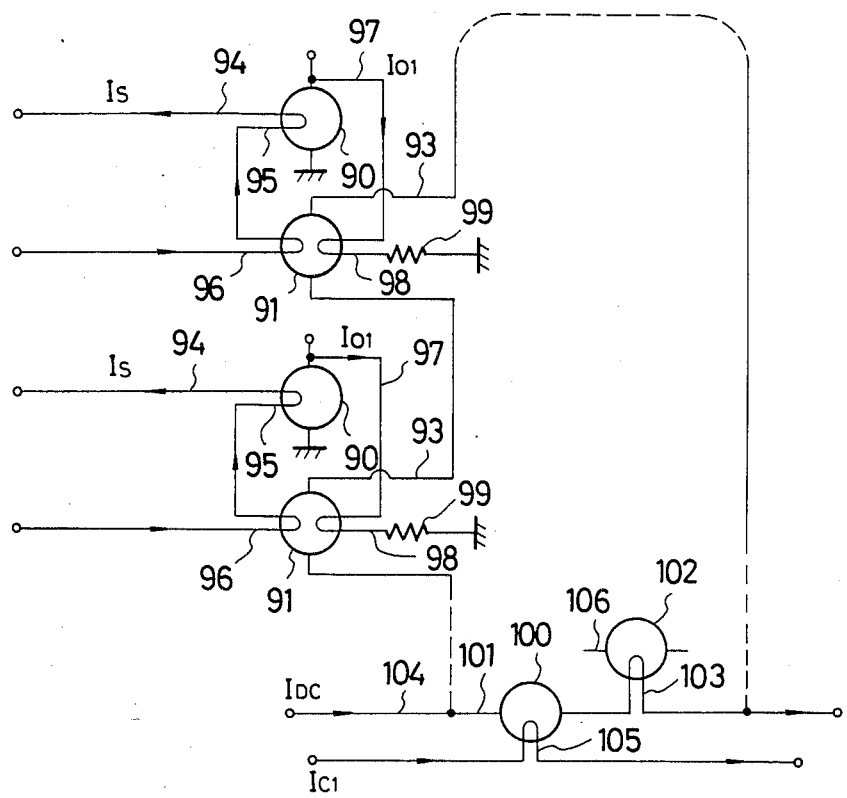
FIG. 10 is an equivalent circuit diagram of a sense-bus circuit as the third embodiment of the Josephson device of the present invention.

FIG. 10 represents the third embodiment of the present invention. This is an application of the Josephson device of this invention to a sense-bus circuit which is used in the memory circuit. Here, the devices of the aforementioned basic configurations are disposed in parallel to each other, with the gate current lines of the mutual second gate circuits connected serially to complete the sense-bus circuit.

In the present embodiment, an input line 95 of a first gate circuit 90 and a first input line of a second gate circuit 91 in each of the devices are serially connected with an input current line 94 similarly to the preceding embodiments. This input current line 94 functions as a sense line for the memory circuit. An output line 97 of the first gate circuit 90 is connected to a second input line 98 of the second gate circuit 91 and further to a load resistor 99. The first and second input lines 96, 98 of the second gate circuit are disposed so that they will pass their input currents in mutually opposite directions. The second gate circuit 91 assumes an asymmetrical control characteristic such as is illustrated in FIG. 6 and the first gate circuit 90 assumes a symmetrical control characteristic such as is illustrated in FIG. 1(b). The gate current lines 93 of the second gate circuits 91 are serially connected to one another. Further, the lines 93 are connected to a gate current line 101 of a third gate circuit 100 connected to an input line 103 of a fourth gate circuit 102. To a DC current supply line 104 connected to the gate current line 101 of the third gate circuit 100, a DC current $I_{DC}$ flows constantly.

From IBM Journal of Research and Development, Vol. 24 No. 2, pp 143–154, it is evident that memory circuits using Josephson junction devices are well known in the art. The information stored in the memory cells of the memory circuit is read out as follows. The flow of an input current $Ic_1$ to an input line 105 causes the third gate circuit 100 to switch to the voltage state and the DC current $I_{DC}$ is fed out to the serial connection of the gate current line 93 of the second gate circuit 91. When, the gate current flows through the gate current line 106 of the fourth gate circuit 102 and, at the same time, a sense current Is flows to the specific sense line 94 connected to the memory cell selected by the decoder circuit, the first gate circuit 90 whose input line is connected to that specific sense line switch to the voltage state and the output current $Io_1$ begins to flow to the second gate circuit 91. Since the second gate circuit 91 possesses an asymmetrical control characteristic, it does not switch to the voltage state during the rise of the sense current Is. This situation is similar to that of the first embodiment of this invention illustrated in FIG. 5. Then, the flow of the aforementioned sense current continues or stops, depending on whether the binary data written in the selected memory cell is "0" or "1". When the flow of the sense current continues, the second gate circuit 91 continues to remain in its zero voltage state and the aforementioned DC current $I_{DC}$ continues to flow through the serial connection of the gate current line 93 of the second gate circuit 91. On the other hand, when the flow of the sense current is discontinued, the second gate circuit 91 switches to the voltage state for the same reason as indicated with respect to the first embodiment of this invention, the aforementioned DC current $I_{DC}$ is again fed to the serial connection of the gate current line 101 of the third gate circuit 100 and the input line 103 of the fourth gate circuit 102, and the fourth gate circuit 102 switches to the voltage state. The binary information written in the selected memory cell is read out, depending on whether or not the fourth gate circuit 102 switches to the voltage state as described above.

Figure 11:
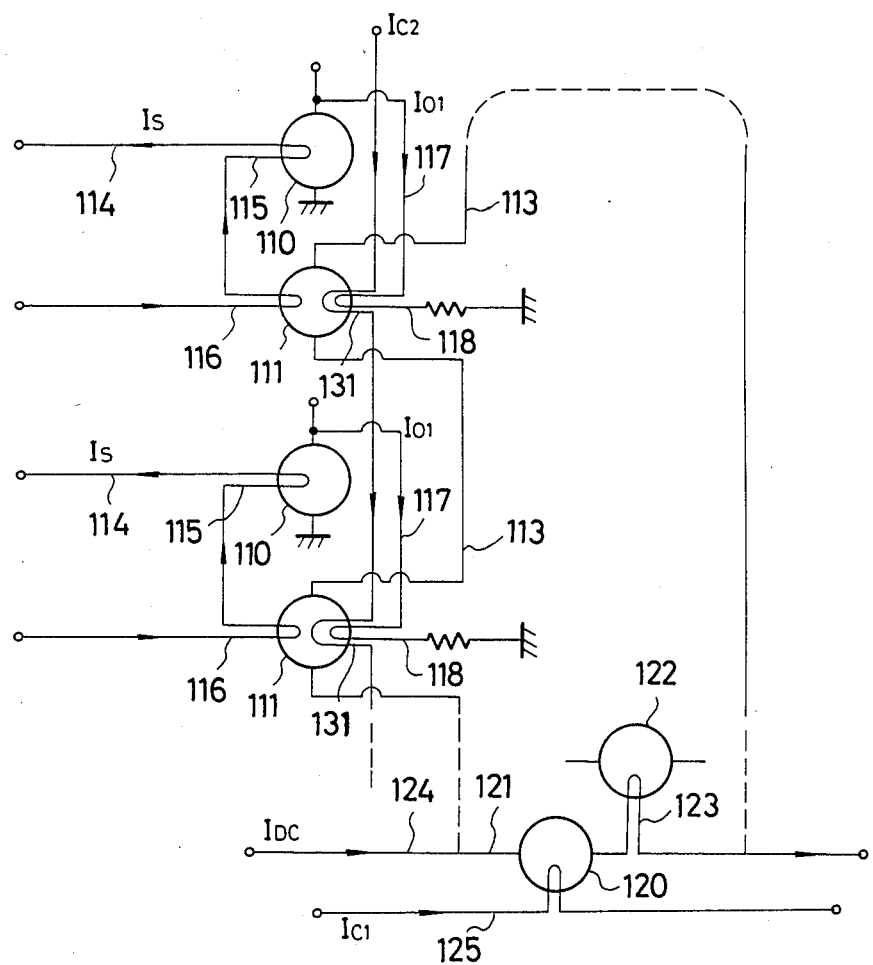
FIG. 11 is an equivalent circuit diagram of a sense-bus circuit as the fourth embodiment of the Josephson device of this invention.

FIG. 11 illustrates the fourth embodiment of this invention, as applied to a sense-bus circuit which is used in a memory circuit. In each of a plurality of sense lines 114 of the memory circuit, an input line 115 of a first gate circuit 110 and a first input line 116 of a second gate circuit 111 are inserted. In the output line 117 of the first gate circuit 110, an input line 118 of the second gate circuit 111 is inserted. Further in the second gate circuit 111, a third input line 131 for passing a DC input current $I_{c2}$ is incorporated. The second and third input lines 118, 131 are disposed to pass their respective input currents in one and the same direction and the first input line 116 is adapted to pass its input current in the opposite direction. The second gate circuit 111 assumes a control characteristic as illustrated in FIG. 9. The gate current lines 113 of the second gate circuit 111 are serially connected to one another and are then connected in parallel to the serial connection of the gate current line 121 of the third gate circuit 120 and the input line 123 of the fourth gate circuit 122. The DC current $I_{DC}$ flows constantly to a DC current supply line 124 which is connected to the aforementioned gate current line 121.

The binary data written in the memory cells of the memory circuit are read out as follows.

The input current $Ic_1$ flows to an input line 125 and the DC current $I_{DC}$ flowing through the third gate circuit is fed to the serial connection of the gate current line 113 of the second gate circuit 111. When, the gate current flows to the fourth gate circuit 122 and, at the same time, the sense current Is flows to the specific sense line 114 which happens to be connected to the memory cell, the gate circuit 110 switches to the voltage state and the output current $Io_1$ is fed out to the gate circuit 111. In this case, the aforementioned gate circuit does not switch to the voltage state for the same reason as described with respect to the second embodiment of this invention in FIG. 8. The flow of the aforementioned sense current continues or stops, depending on whether the binary data written in the selected memory cell is "0" or "1". When the sense current continues to flow, the second gate circuit 111 continues to remain in the zero voltage state. When the flow of the sense current Is is discontinued, the second gate circuit 111 switches to the voltage state, the aforementioned DC current $I_{DC}$ again begins to flow through the gate current line of the third gate circuit 120 and the input current line 123 of the fourth gate circuit 122, and the fourth gate circuit 122 switches to the voltage state. As described above, the binary data written in the selected memory cell is read out depending on whether or not the fourth gate circuit 122 switches to the voltage state.

The down-edge detecting circuit of the present invention provides a much wider operating margin for the gate current than the conventional countertype. It has the advantage that this circuit does not require the inductance to be selected at a high level and, therefore, is suitable for high density circuit integration. It also enjoys the advantage that it can be designed easily because the operating points of the gate current are not directly affected by the dynamic characteristic of the gate circuit such as the critical points of voltage and vortex transition involved in the conventional countertype.

What is claimed is:

1. A Josephson device, comprising:
   a first gate circuit composed of a loop circuit incorporating a plurality of Josephson junctions, an input line magnetically connected to said loop circuit, a gate current line connected to said loop circuit and an output line connected to said gate current line; and
   a second gate circuit composed of a loop circuit incorporating a plurality of Josephson junctions, a first input line serially connected to said input line of said first gate circuit, a second input line serially connected to said output line of said first gate circuit and adapted to pass an input current in the direction opposite to said first input line, a gate current line connected to said loop circuit, and an output line connected to said gate current line.

2. A Josephson device according to claim 1, wherein said second gate circuit is asymmetrical in control characteristic relative to one polarity of the input current.

3. A Josephson device according to claim 2, wherein said device is a down-edge detecting circuit.

4. A Josephson device according to claim 1, wherein a third input line is additionally incorporated in said second gate circuit so as to allow the input current to flow through said third input line in the same direction as the input current flowing through said second input line of said second gate circuit.

5. A Josephson device according to claim 4, wherein said second gate circuit is symmetrical in control characteristic relative to one polarity of the input current.

6. A Josephson device according to claim 5, wherein said device is a down-edge detecting circuit.

7. A Josephson device, incorporating a plurality of down-edge detecting circuits each comprising a first gate circuit composed of a loop circuit incorporating a plurality of Josephson junctions, an input line magnetically connected to said loop circuit, a gate current line connected to said loop circuit and an output line connected to said gate current line; and a second gate circuit composed of a loop circuit incorporating a plurality of Josephson junctions, a first input line serially connected to said input line of said first gate circuit, a second input line serially connected to said output line of said first gate circuit and adapted to pass an input current in the direction opposite to said first input line, a gate current line connected to said loop circuit, and an output line connected to said gate current line, and having the gate current lines of said second gate circuits in the respective down-edge detecting circuits serially connected to one another.

8. A Josephson device according to claim 7, wherein said device is to a sense-bus circuit.

9. A Josephson device according to claim 7, wherein a third input line is adapted to pass an input current in the direction opposite the direction of the input current flowing through said first input line of said second gate circuit of each of said down-edge detecting circuits and in the same direction as that of the input current flowing through said second input line.

10. A Josephson device according to claim 9, wherein said device is a sense-bus circuit.

* * * * *